United States Patent [19]
Liu et al.

[11] Patent Number: 6,015,749
[45] Date of Patent: Jan. 18, 2000

[54] METHOD TO IMPROVE ADHESION BETWEEN COPPER AND TITANIUM NITRIDE, FOR COPPER INTERCONNECT STRUCTURES, VIA THE USE OF AN ION IMPLANTATION PROCEDURE

[75] Inventors: Chung-Shi Liu; Chen-Hua Douglas Yu; Jane-Bai Lai; Lih-Juann Chen, all of Hsinchu, Taiwan

[73] Assignee: Taiwan Semiconductor Manufacturing Company, Hsin-chu, Taiwan

[21] Appl. No.: 09/072,004

[22] Filed: May 4, 1998

[51] Int. Cl.[7] ............................................. H01L 21/4763
[52] U.S. Cl. .................... 438/628; 438/629; 438/644; 438/654; 438/660; 438/663; 438/687
[58] Field of Search ................... 438/628, 629, 438/644, 654, 660, 663, 687

[56] References Cited

U.S. PATENT DOCUMENTS

| | | | |
|---|---|---|---|
| 5,288,456 | 2/1994 | Aboelfotoh et al. | 420/469 |
| 5,391,517 | 2/1995 | Gelatos et al. | 437/190 |
| 5,403,779 | 4/1995 | Joshi et al. | 437/190 |
| 5,420,069 | 5/1995 | Joshi et al. | 437/187 |
| 5,674,787 | 10/1997 | Zhao et al. | 437/230 |
| 5,677,244 | 10/1997 | Venkatraman | 437/198 |
| 5,698,869 | 12/1997 | Yoshimi et al. | 257/192 |
| 5,731,245 | 3/1998 | Joshi et al. | 438/705 |
| 5,801,444 | 9/1998 | Aboelfotoh et al. | 257/762 |
| 5,877,084 | 3/1999 | Joshi et al. | 438/46 |
| 5,897,370 | 4/1999 | Joshi et al. | 438/632 |

Primary Examiner—Richard Booth
Assistant Examiner—David A Zarneke
Attorney, Agent, or Firm—George O. Saile; Stephen B. Ackerman

[57] ABSTRACT

A method for fabricating a copper interconnect structure, using a $Cu_3Ge$ intermetallic layer, as an adhesive layer, has been developed. Following the deposition of a copper seed layer, an ion implantation procedure is performed, placing germanium ions in a copper seed layer. After deposition of a thick copper layer, an anneal cycle, performed before or after deposition of the thick copper layer, is used to create a $Cu_3Ge$ intermetallic layer at the interface between a copper seed layer and a titanium nitride barrier layer. A second embodiment of this invention uses a tilted, germanium ion implantation procedure, used to avoid the placement of germanium ions in a copper seed layer, at the bottom of a contact hole, thus avoiding possible implantation damage, to active device regions, exposed in the bottom of the contact hole.

18 Claims, 5 Drawing Sheets

METHOD TO IMPROVE ADHESION BETWEEN COPPER AND TITANIUM NITRIDE, FOR COPPER INTERCONNECT STRUCTURES, VIA THE USE OF AN ION IMPLANTATION PROCEDURE

RELATED PATENT APPLICATION

"USE OF A LOW RESISTIVITY $Cu_3Ge$ INTERLAYER AS AN ADHESION PROMOTER BETWEEN COPPER AND TiN LAYERS" by J. B. Lai, L. J. Chen, C. S. Liu, C. H. Yu, of Taiwan Semiconductor Manufacturing Corporation, invention disclosure TSMC97-494, (February., 1998), assigned to a common assignee

BACKGROUND OF THE INVENTION (1) Field of the Invention

The present invention relates to a method used to fabricate metal interconnect structures, for semiconductor devices, and more specifically to a process used to improve the adhesion of a copper layer, used as a component of the metal interconnect structure, to underlying surfaces.

(2) Description of Prior Art

The semiconductor industry is continually attempting to increase device performance while still attempting to lower the manufacturing cost for these same semiconductor devices. The ability to create semiconductor devices with sub-micron features, or micro-miniaturization, has allowed the performance and cost objectives to be successfully addressed. For example smaller features result in decreases in performance degrading capacitances and resistances, for device regions in the semiconductor substrate. In addition the use of sub-micron features, allows smaller semiconductor chips to be realized, however still possessing device densities comparable to densities achieved with larger semiconductor chip counterparts. This allows more chips to be realized from a specific size starting substrate, thus reducing the processing cost for a specific semiconductor chip.

In addition to the performance and cost benefits attributed to micro-miniaturization, the semiconductor industry is still attempting to improve device performance by utilizing copper wiring, in place of the lower conductivity, aluminum wiring, now being used for advanced semiconductor devices. The low resistivity, about 1.7E-6 ohm–cm, of copper, would allow the use of thinner interconnect structures, still providing the same desired current carrying capabilities as thicker aluminum counterparts. In addition, for a specific current density, copper would provide a greater degree of electromigration resistance, than aluminum based counterparts. However the use of copper interconnect structures introduces several new concerns, not relevant with the aluminum based metallization. First, copper must be separated from underlying dielectric layers, or from semiconductor regions, due to the deleterious effects resulting from interaction of copper with insulator or silicon layers. Therefore barrier layers, underlying copper layers, are needed to prevent the deleterious effects of copper in silicon, or in silicon oxide layers. In addition the adhesion between copper and underlying barrier layers is not as strong as the adhesion between aluminum and underlying dielectric materials, therefore an adhesion layer is sometimes added to metal interconnect structures, which use copper as the major conductive component.

Prior art, such as Gelatos, et al, in U.S. Pat. No. 5,391,517, describe an interconnect structure, using copper as the main current carrying component, in which a layer of titanium nitride is used as a barrier layer, to prevent unwanted copper from entering underlying materials. This prior art also uses a titanium—copper, intermetallic layer, placed between the copper layer, and the underlying titanium nitride layer, to improve copper adhesion to underlying materials. The present invention will describe a novel process for forming a copper—germanium, ($Cu_3Ge$), intermetallic layer, to be used as an adhesive layer between an overlying thick copper layer and an underlying titanium nitride barrier layer, with the $Cu_3Ge$ layer formed using a procedure consisting of ion implantation of germanium into a copper seed layer, an electro-chemical deposition of copper, and an anneal treatment, performed before or after the Cu ECD procedure, creating the $Cu_3Ge$ intermetallic layer between the copper seed—titanium nitride interface. In addition when using copper interconnect structures to fill contact holes, for cases in which silicon device regions are exposed at the bottom of the contact hole, an ion implantation procedure can be performed using a tilted angle, thus avoiding implant damage to silicon device regions exposed in the contact hole. The low resistivity of $Cu_3Ge$, compared to other adhesive layers, makes this intermetallic layer a good candidate for use in copper interconnect structures.

SUMMARY OF THE INVENTION

It is an object of this invention to use copper for low resistance, interconnect structures.

It is another object of this invention to use a $Cu_3Ge$ intermetallic layer, to improve the adhesion between an overlying thick copper layer and an underlying material such as a titanium nitride layer.

It is still another object of this invention to form a $Cu_3Ge$ intermetallic layer via ion implantation of germanium into a seed layer of copper, and an anneal treatment that is performed before or after an electro-chemical deposition of a thick copper layer.

It is yet another object of this invention to use a tilted, germanium ion implantation procedure, to prevent implant damage to materials such as silicon or metal silicide, exposed at the bottom of a contact hole.

In accordance with the present invention, a method is described for forming copper interconnect structures, for semiconductor devices, using a $Cu_3Ge$ intermetallic layer, to provide adhesion for copper to underlying materials. A semiconductor substrate, with a top surface comprised of a dielectric material, and with a contact hole in the dielectric material, exposing silicon or metal silicide surfaces at the bottom of the contact hole, is provided. A first embodiment of this invention encompasses the deposition of a titanium nitride barrier layer and of a copper seed layer. A germanium ion implantation procedure is used to place germanium ions at the copper seed—titanium nitride interface, in regions in which these materials reside on the top surface of the dielectric material, as well as in the region in which these materials reside at the bottom of the contact hole. The ion implantation procedure did not place germanium ions in materials residing on the sides of the contact hole. A thick copper layer is next formed via electro-chemical deposition, (ECD), procedures, completely filling the contact hole. An anneal treatment is then performed, before or after the copper ECD procedure, resulting in the formation of a $Cu_3Ge$ intermetallic layer, located between an overlying portion of the copper seed layer and the underlying titanium nitride layer. The $Cu_3Ge$ intermetallic layer is not formed on the sides of the contact hole. Subsequent patterning procedures result in a copper interconnect structure on the top surface of the dielectric material, and in the contact hole, comprised of a thick copper, a copper seed layer, a $Cu_3Ge$ intermetallic layer, and a titanium nitride barrier layer.

A second embodiment of this invention features a tilted angle, germanium ion implantation procedure, applied to the copper seed layer, used for formation of the $Cu_3Ge$ intermetallic layer. The use of a tilted angle, does not allow ion implantation to occur at the bottom of the contact hole thus avoiding implantation damage to silicon or metal silicide materials, exposed in the bottom of the contact hole. Subsequent deposition of thick copper, followed by anneal procedures, performed before or after the copper ECD procedure, result in the formation of the $Cu_3Ge$ intermetallic layer only on the top surface of the dielectric material.

BRIEF DESCRIPTION OF THE INVENTION

The object and other advantages of this invention are best described in the preferred embodiment with reference to the drawings that include:

FIGS. 1–6, which schematically, in cross-sectional style, show the stages of formation of a copper interconnect structure, featuring the $Cu_3Ge$ intermetallic, adhesion layer, on the top surface of dielectric layer, and at the bottom of a contact hole.

FIGS. 7–10, which schematically, in cross-sectional style, show the stages of fabrication, used to form a copper interconnect structure only on the top surface of a dielectric material, via a tilted, germanium ion implantation procedure.

DESCRIPTION OF THE PREFERRED EMBODIMENTS

The method of fabricating a copper interconnect structure, featuring a $Cu_3Ge$ intermetallic layer, to improve adhesion between copper, and underlying materials, will now be described in detail. The use of interconnect structures, using copper as the major conductive component, and using a low resistivity $Cu_3Ge$ intermetallic layer for adhesion purposes, can be used for any level of metal interconnect, such as a first level interconnect structure, either directly contacting underlying active device regions, in a semiconductor substrate, or contacting a conductive plug, which in turn contacts underlying semiconductor device regions, or contacts other metal interconnect structures. The copper interconnect structure of this invention can also be used for upper levels of metal interconnect structures.

Figure 1:
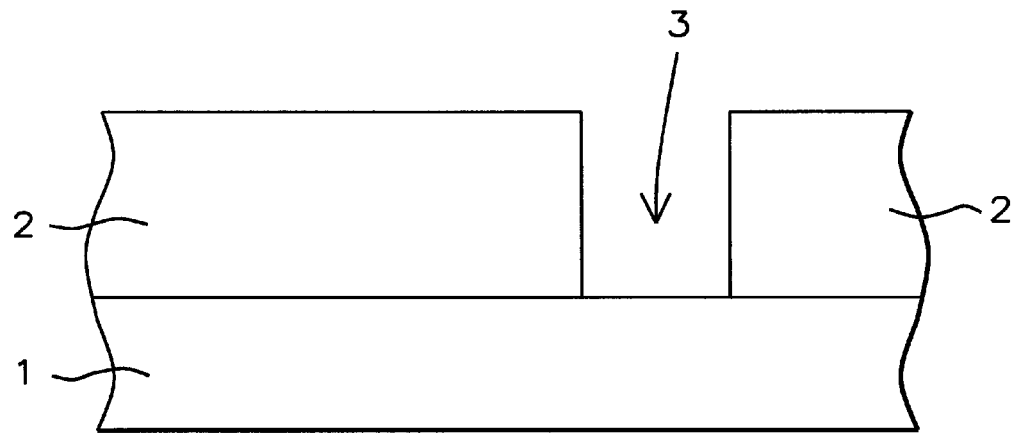

FIG. 1, schematically shows a semiconductor substrate 1, with an overlying insulator layer 2. Insulator layer 2, can be a silicon oxide layer, a silicon nitride layer, a borophosphosilicate layer, or a phosphosilicate layer. A contact hole 3, is formed in insulator layer 2, exposing a region of semiconductor substrate 1, at the bottom of contact hole 3. The region of semiconductor substrate 1, exposed at the bottom of contact hole 3, can be silicon, or a metal silicide such as platinum silicide or titanium silicide. In addition, if this invention is used to create upper levels of copper interconnect structures, contact hole 3, can be a via hole, and the material at the bottom of the via hole can be a metal or a metal silicide layer.

Figure 2:
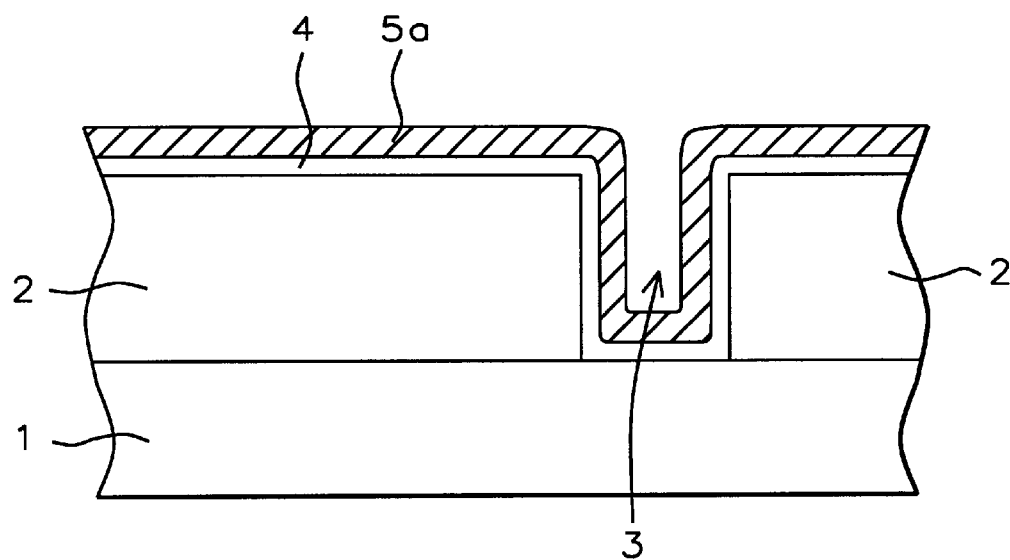

A layer of titanium nitride 4, is deposited using chemical vapor deposition, (CVD), at a temperature between about 200 to 450° C., to a thickness between about 100 to 500 Angstroms. Titanium nitride layer 4, shown schematically in FIG. 2, can also be deposited using R.F. sputtering, and will serve as a barrier layer, for a subsequent, overlying copper layer, preventing copper from reaching underlying regions, such as insulator layer 2, or silicon or metal silicide regions, located at the bottom of contact hole 4. In general, for purposes of lowering contact/via resistance, sputter etching, and/or a titanium deposition, are performed prior to titanium nitride deposition. A copper seed layer 5a, is next deposited again using CVD procedures, at a temperature between about 150 to 450° C., to a thickness between about 200 to 1500 Angstroms, using Copper(I)—Hexafluoroacetylacetone Trimethylvintlsilane, (Cu—HFAC—TMVS), as reactants. Copper seed layer 5a, can also be deposited using physical vapor deposition, (PVD), procedures. The result of this deposition is also shown schematically in FIG. 2.

Figure 3:
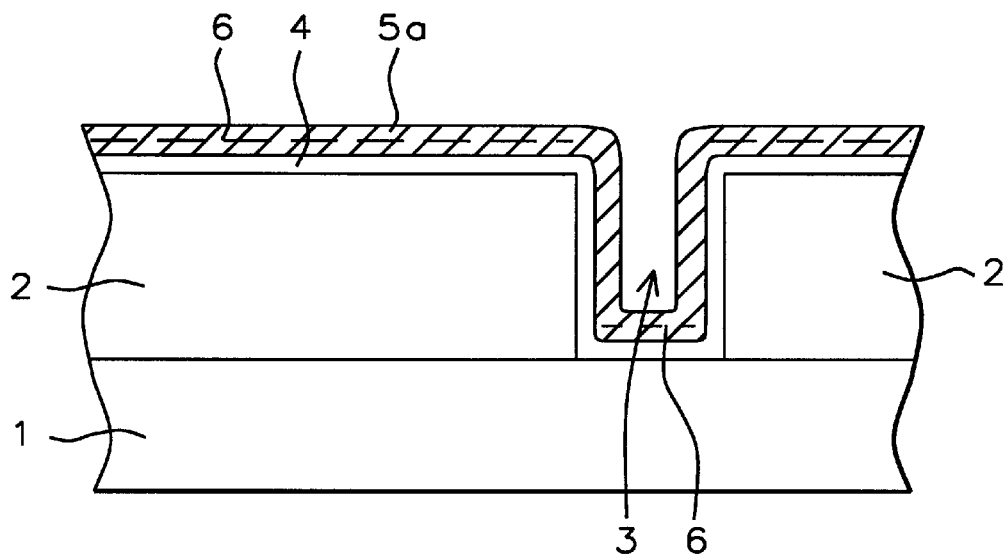
Figure 4:
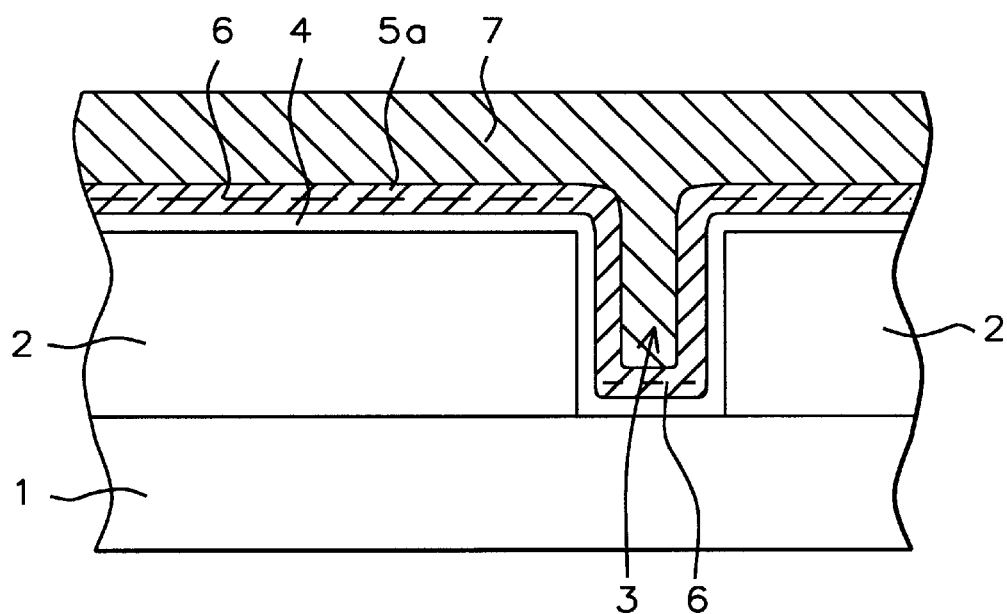

A first embodiment of this invention initiates with a critical ion implantation procedure, used to place germanium ions 6, in copper seed layer 5a, at the interface of copper seed layer 5a, —titanium nitride layer 4. The germanium ion implantation procedure, is performed at an energy between about 30 to 500 KeV, at a dose between about 1E15 to 5E16 atoms/$cm^2$, and at an implant angle between about 0 to 20 degrees. The implant angle used results in germanium ions 6, in copper seed layer 5a, only in the regions in which copper seed layer 5a, resided on surfaces normal to the implantation angle, thus resulting in an absence of implanted germanium ions 6, in copper seed layer 5a, in the region in which copper seed layer 5a, resided on the sides of contact hole 3. This is schematically shown in FIG. 3. A thick copper layer 7, is next deposited, via an electro-chemical deposition, (ECD), procedure, using dissociation and reduction of copper sulfate, at a temperature of about 30° C., at atmospheric pressure, and at a deposition rate between about 2000 to 6000 Angstroms/min., resulting in a thickness between about 3000 to 15000 Angstroms. This is schematically seen in FIG. 4.

Figure 5:
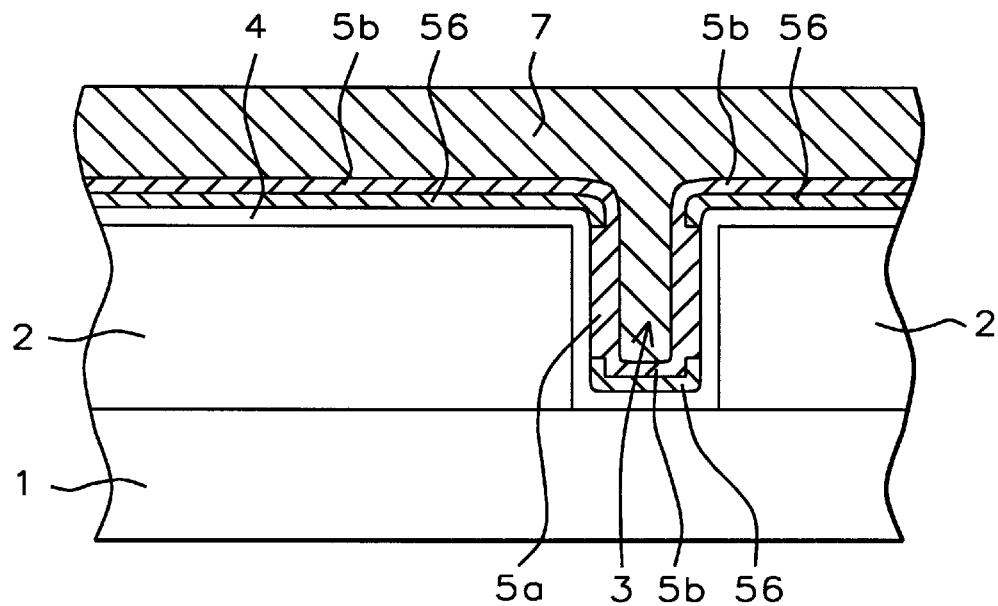
Figure 6:
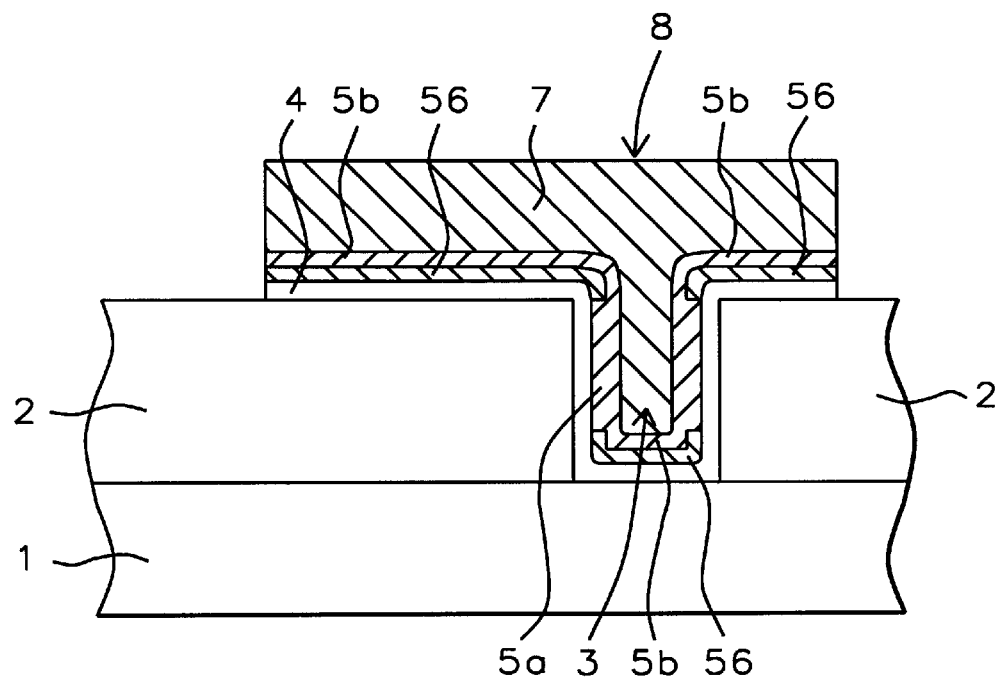

An anneal procedure is next performed using a conventional furnace, or rapid thermal processing, (RTP), at a temperature between about 150 to 450° C., in either a hydrogen, or a hydrogen—nitrogen environment, or in vacuum, for a time between about 0.5 to 30 min, creating $Cu_3Ge$ intermetallic layer 56, schematically shown in FIG. 5. The anneal procedure can also be performed prior to deposition of thick copper layer 7. The formation of $Cu_3Ge$ intermetallic layer 56, at a thickness between about 20 to 100 Angstroms, consumes all germanium ions 6, and a portion of copper seed layer 5a, resulting in a thinner copper layer 5b, overlaying $Cu_3Ge$ intermetallic layer 56. $Cu_3Ge$ intermetallic layer 56, will provide improved adhesion between thick copper layer 7, and underlying materials. $Cu_3Ge$ intermetallic layer 56, is formed on the titanium nitride layer 4, in the region in which titanium nitride layer 4, resides on the top surface of insulator layer 2, and in the region in which titanium nitride layer 4, resides at the bottom of contact hole 3. $Cu_3Ge$ intermetallic layer 56 did not form on the sides of contact hole 3, as a result of the absence of germanium ions 6, in copper seed layer 5a, in regions in which copper seed layer 5a, resided on the sides of contact hole 3. Photolithographic and reactive on etching, (RIE), procedures, using $Cl_2$ as an etchant for thick copper layer 7, thinner copper seed layer 5b, $Cu_3Ge$ intermetallic layer 56, and titanium nitride layer 4, are used to create copper interconnect structure 8, schematically shown in FIG. 6. Removal of a photoresist shape, used as a etch mask for copper interconnect structure 8, is accomplished using plasma oxygen ashing and careful wet cleans.

Another method to create a copper interconnect structure is via use of a copper, chemical mechanical polishing, (CMP), or copper damascene process. After opening a via in an insulator layer, exposing an underlying conductive layer, the titanium nitride barrier layer and the copper seed layer are deposited. After a germanium ion implantation procedure, and an anneal procedure, used to form the $Cu_3Ge$ intermetallic layer, a thick copper layer is deposited via the ECD procedure. A chemical mechanical polishing procedure is then employed to remove materials from the top surface of the insulator layer, resulting in the copper composite, residing only in the via hole.

A second embodiment of this invention is the use of ion implanted germanium ions, for subsequent formation of an $Cu_3Ge$ intermetallic layer, however using a tilted angle for the ion implantation procedure. The use of the tilted angle, avoids ion implantation into materials at the bottom of the contact hole, and thus avoids possible implant damage to silicon or metal silicide materials, underlying the titanium nitride barrier layer at the bottom of the contact hole. A fraction of higher energy germanium ions may not be stopped by thin titanium nitride layers, at the bottom of the contact hole, thus the use of a large angle implantation procedure is necessary. In addition if the copper seed layer is deposited using PVD procedures, such as R.F. sputtering or evaporation, a thinner than desired copper seed layer may be present at the bottom of a contact hole, due to the poorer conformality of the PVD layer, in contrast to the more conformal CVD counterparts. Therefore the thinner, less conformal PVD copper seed layer, may allow penetration of the germanium implant, damaging underlying device regions.

Figure 7:
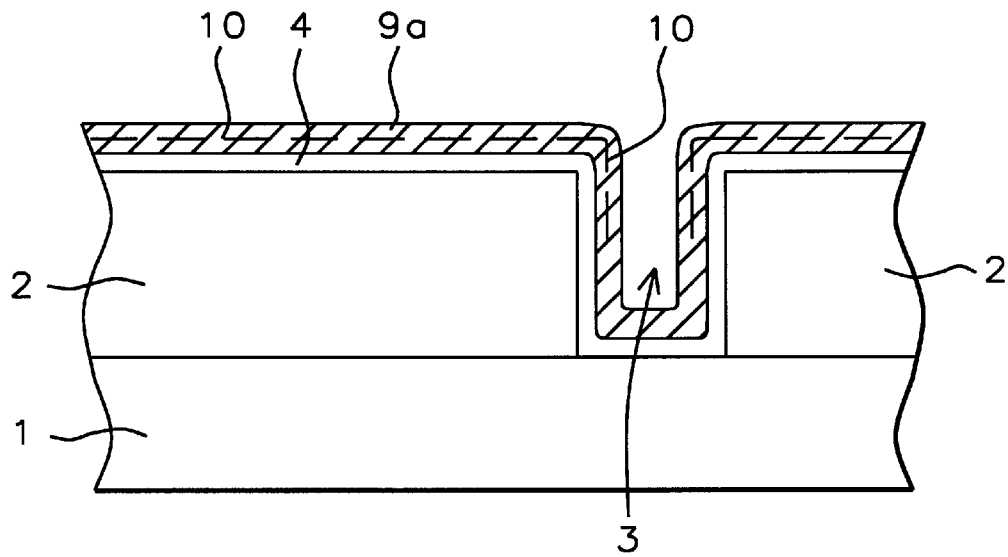

FIG. 7, again schematically shows titanium nitride barrier layer 4, at a thickness between about 100 to 500 Angstroms, and a copper seed layer 9a, at a thickness between about 200 to 1500 Angstroms, obtained via CVD, or R.F. sputtering procedures. A germanium ion implantation procedure is used, at an energy between about 30 to 500 KeV, at a dose between about 1E15 to 5E16 atoms/$cm^2$, and at an implant angle between about 15 to 60 degrees. The use of this implant angle places germanium ions 10, in copper seed layer 9a, in regions where copper seed layer 9a, on barrier layer 4, resides on the top surface of insulator layer 2. The large implant angle also allows a portion of copper seed layer 9a, residing on the sides of contact hole 3, near the top of contact hole 3, to experience the germanium implantation procedure. The materials at the bottom of contact hole 3, however, are not exposed to this ion implantation procedure, thus avoiding implant damage.

Figure 8:
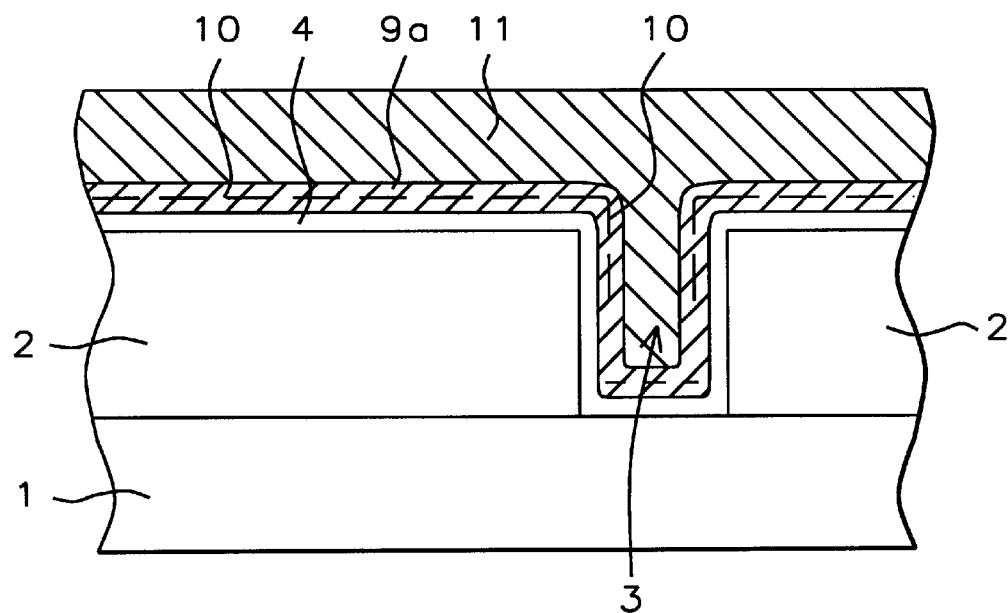
Figure 9:
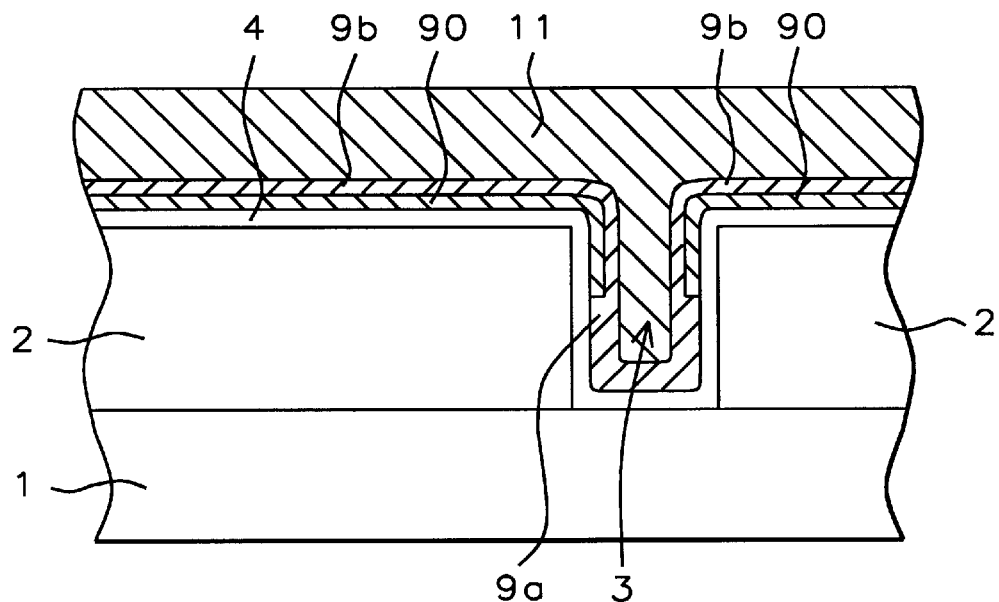
Figure 10:
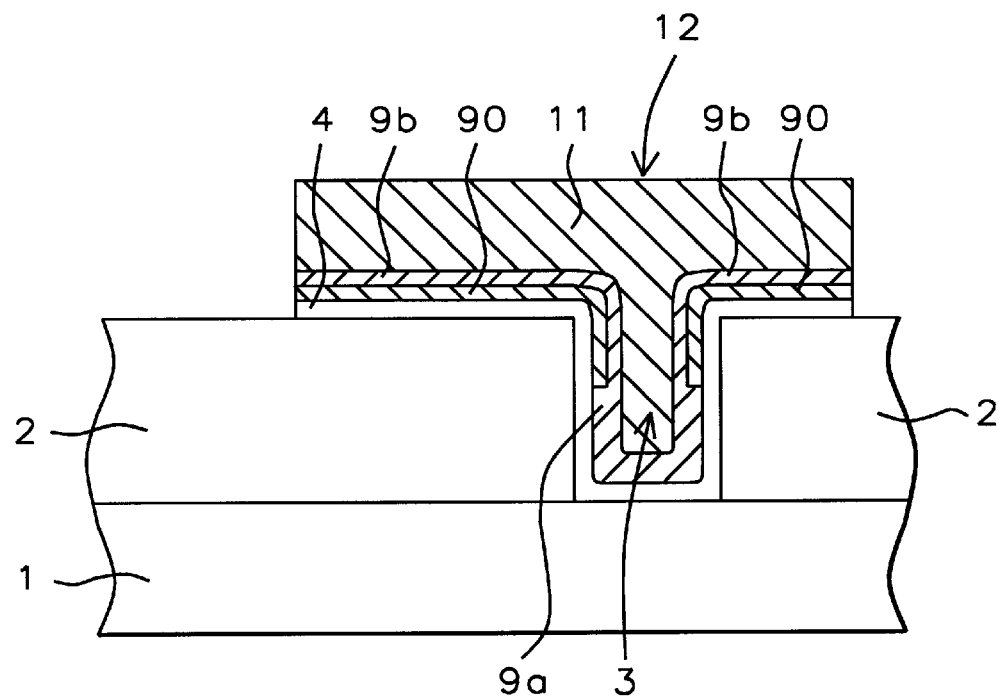

A thick copper layer 11, is next deposited, via an ECD procedure, to a thickness between about 3000 to 15000 Angstroms, shown schematically in FIG. 8. The result of an anneal treatment, again performed using conventional furnace processing, or an RTP procedure, at a temperature between about 150 to 450° C., for a time between about 0.5 to 30 min, in either a hydrogen or hydrogen nitrogen ambient, or in vacuum, is schematically shown in FIG. 9, in the form of $Cu_3Ge$ intermetallic layer 90, being created in copper seed layer 9a, in regions in which germanium ions 10, previously existed. A thinner copper seed layer 9b, is shown in regions in which portions of copper seed layer 9a, was consumed during the formation of $Cu_3Ge$ intermetallic layer 90. The absence of $Cu_3Ge$ intermetallic layer 90, is observed at the bottom of contact hole 3, as a result of the tilted angle implantation procedure, not allowing germanium implantation to occur in that area. Photolithographic and RIE procedures, identical to procedures previously used in the first embodiment, are again used to create copper interconnect structure 12, shown schematically in FIG. 10, where $Cu_3Ge$ intermetallic layer 90, is used to provide increased adhesion between thick copper layer 11, and underlying materials, but where $Cu_3Ge$ intermetallic layer 90, is formed without subjecting active device regions, at the bottom of contact hole 3, to damaging ion implantation procedures.

While this invention has been particularly shown and described with reference to the preferred embodiments thereof, it will be understood by those skilled in the art that various changes in form and details may be made without departing from the spirit and the scope of this invention.

What is claimed is:

1. A method for forming a metal interconnect structure, on a semiconductor substrate, comprising the steps of:

providing a insulator layer, on said semiconductor substrate, and providing a contact hole in said insulator layer, exposing underlying conductive elements;

depositing a barrier layer;

depositing a copper seed layer;

ion implanting germanium ions into a first region of said copper seed layer, in which said copper seed layer, and said barrier layer, reside on the top surface of said insulator layer, and ion implanting said germanium ions into a second region of said copper seed layer, in which said copper seed layer, and said barrier layer reside on the top surface of said conductive elements, located at the bottom of said contact hole;

depositing a thick copper layer;

annealing, before or after deposition of said thick copper layer, to form a $Cu_3Ge$ intermetallic layer, with the formation of said $Cu_3Ge$ intermetallic layer consuming all of said germanium ions, and consuming a bottom portion of said copper seed layer, and with said $Cu_3Ge$ intermetallic layer forming in said first region of said copper seed layer, and forming said $Cu_3Ge$ intermetallic layer in said second region of said copper seed layer; and patterning, via use of dry etching or damascene procedures, of said thick copper layer, of said copper seed layer, of said $Cu_3Ge$ intermetallic layer, and of said barrier layer, to form said metal interconnect structure.

2. The method of claim 1, wherein said underlying conductive elements, exposed in the bottom of said contact hole, are active silicon device regions, in said semiconductor substrate.

3. The method of claim 1, wherein said underlying conductive elements, exposed at the bottom of said contact hole are metal silicide layers, such as titanium silicide.

4. The method of claim 1, wherein said contact hole can be a via hole, if copper is being used for upper level interconnect structures, with the underlying materials being conductive elements such as copper, aluminum—copper, or tungsten.

5. The method of claim 1, wherein said barrier layer is titanium nitride, deposited using CVD procedures, at a temperature between about 200 to 450° C., to a thickness between about 100 to 500 Angstroms.

6. The method of claim 1, wherein said copper seed layer is deposited using CVD procedures, at a temperature between about 150 to 450° C., to a thickness between about 200 to 1500 Angstroms, using copper—HFAC—TMVS as reactants.

7. The method of claim 1, wherein said germanium ions are ion implanted into said first region of said copper seed layer, and into said second region of said copper seed layer, at an energy between about 30 to 500 KeV, at a dose between about 1E15 to 5E16 atoms/cm$^2$, and at an implant angle between about 0 to 20 degrees.

8. The method of claim 1, wherein said thick copper layer is deposited using electro-chemical deposition, (ECD), procedures, to a thickness between about 3000 to 15000 Angstroms.

9. The method of claim 1, wherein said Cu$_3$Ge intermetallic layer is formed via an anneal procedure, performed using conventional furnace procedures, or performed using rapid thermal processing, at a temperature between about 150 to 450° C., for a time between about 0.5 to 30 min, in either a hydrogen or a hydrogen—nitrogen ambient, or in vacuum.

10. A method for forming a copper interconnect structure, on a semiconductor substrate, with a Cu$_3$Ge intermetallic layer used as an adhesion layer, and with said Cu$_3$Ge intermetallic layer formed using a tilted angle, germanium ion implantation procedure, comprising the steps of:

providing an insulator layer, on said semiconductor substrate, and providing a contact hole in said insulator layer, exposing conductive elements at the bottom of said contact hole;

depositing a titanium nitride layer;

depositing a copper seed layer;

using a tilted implant angle to ion implant germanium ions into a first region of said copper seed layer, where said copper seed layer, on said titanium nitride layer, resides on the top surface of said insulator layer, and ion implanting said germanium ions into a second region of said copper seed layer, where said copper seed layer, on said titanium nitride layer, resides on a top portion of the sides of said contact hole;

depositing a thick copper layer;

annealing to form said Cu$_3$Ge intermetallic layer, via consumption of all said germanium ions, and consumption of a bottom portion of said copper seed layer, and with said Cu$_3$Ge intermetallic layer forming in said first region of said copper seed layer, and said Cu$_3$Ge intermetallic layer forming in said second region of said copper seed layer; and patterning, via use of dry etching or damascene procedures, of said thick copper layer, of said copper seed layer, of said Cu$_3$Ge intermetallic layer, and of said titanium nitride layer, to form said copper interconnect structure.

11. The method of claim 10, wherein said conductive elements, at the bottom of said contact hole, are active silicon device regions in said semiconductor substrate.

12. The method of claim 10, wherein said conductive elements, in the bottom of said contact hole are metal silicide layers, such as titanium silicide.

13. The method of claim 10, wherein said titanium nitride barrier layer, is deposited using CVD procedures, at a temperature between about 200 to 450° C., to a thickness between about 100 to 500 Angstroms.

14. The method of claim 10, wherein said copper seed layer is deposited using CVD procedures, at a temperature between about 150 to 450° C., to a thickness between about 200 to 1500 Angstroms, using copper—HFAC—TMVS as reactants.

15. The method of claim 10, wherein said copper seed layer is deposited using PVD procedures, to a thickness between about 200 to 1500 Angstroms.

16. The method of claim 10, wherein said germanium ions are ion implanted, into said first region of said copper seed layer, and into said second region of said copper seed layer, at an energy between about 30 to 500 KeV, at a dose between about 1E15 to 5E16 atoms/cm$^2$, and at an implant angle between about 15 to 60 degrees.

17. The method of claim 10, wherein said thick copper layer is deposited using ECD procedures, to a thickness between about 3000 to 15000 Angstroms.

18. The method of claim 10, wherein said Cu$_3$Ge intermetallic layer is formed using an anneal procedure performed using conventional furnace procedures, or using rapid thermal processing, at a temperature between about 150 to 450° C., for a time between about 0.5 to 30 min., in either a hydrogen, or a hydrogen—nitrogen ambient, or in vacuum.

* * * * *